(12) United States Patent
Hikmet et al.

(10) Patent No.: US 9,599,293 B2
(45) Date of Patent: Mar. 21, 2017

(54) FULL SPECTRUM LIGHT EMITTING ARRANGEMENT

(71) Applicant: KONINKLIJKE PHILIPS N.V., Eindhoven (NL)

(72) Inventors: Rifat Ata Mustafa Hikmet, Eindhoven (NL); Ties Van Bommel, Horst (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 347 days.

(21) Appl. No.: 14/390,422

(22) PCT Filed: Apr. 3, 2013

(86) PCT No.: PCT/IB2013/052652
§ 371 (c)(1),
(2) Date: Oct. 3, 2014

(87) PCT Pub. No.: WO2013/150455
PCT Pub. Date: Oct. 10, 2013

(65) Prior Publication Data
US 2015/0176777 A1    Jun. 25, 2015

Related U.S. Application Data

(60) Provisional application No. 61/620,522, filed on Apr. 5, 2012.

(51) Int. Cl.
*F21K 99/00* (2016.01)
*H01L 33/50* (2010.01)
(Continued)

(52) U.S. Cl.
CPC .......... *F21K 9/56* (2013.01); *F21K 9/64* (2016.08); *F21V 9/10* (2013.01); *F21V 9/16* (2013.01);
(Continued)

(58) Field of Classification Search
CPC ..... F21K 9/56; F21K 9/64; F21V 9/10; F21V 9/16; F21V 14/003; H01L 33/504;
(Continued)

(56) References Cited

U.S. PATENT DOCUMENTS

2005/0135079 A1    6/2005    Yin Chua et al.
2010/0157572 A1*   6/2010    Wei .......................... F21V 9/10
                                                                    362/84
(Continued)

FOREIGN PATENT DOCUMENTS

EP      2214218         8/2010
WO      WO2008112886    9/2008
(Continued)

OTHER PUBLICATIONS

EPO as ISA, PCT/IB2013/052652 filed Apr. 3, 2013, "International Search Report and Written Opinion" mailed Aug. 16, 2013, 10 pages.
(Continued)

*Primary Examiner* — Laura Tso
(74) *Attorney, Agent, or Firm* — Patent Law Group LLP; Brian D. Ogonowsky (57) ABSTRACT

A light emitting arrangement is provided, comprising:—a solid state light source (101) adapted to emit primary light (L1); and—a wavelength converting member (102) comprising a plurality of wavelength converting domains (102*a*, 102*b*, 102*c*, etc) for converting primary light into secondary light (L2), each wavelength converting domain thereby providing a sub-range of the total light output spectrum, wherein at least some of said wavelength converting domains are arranged as an array and comprise quantum dots, wherein different wavelength converting domains comprise quantum dots having different secondary light emission ranges providing different sub-ranges of the total
(Continued)

light output spectrum, and wherein a sub-range provided by each wavelength converting domain overlaps or is contiguous with at least one other sub-range provided by another wavelength converting domain. By arranging materials having different wavelength conversion properties in different domains, preferably in a plane, re-absorption of secondary emission can be avoided.

13 Claims, 7 Drawing Sheets (51) Int. Cl.
- *F21V 9/10* (2006.01)
- *F21V 9/16* (2006.01)
- *F21V 14/00* (2006.01)
- *F21Y 101/00* (2016.01)
- *F21Y 105/00* (2016.01)

(52) U.S. Cl.
CPC .......... F21V 14/003 (2013.01); H01L 33/504 (2013.01); H01L 33/508 (2013.01); *F21Y 2101/00* (2013.01); *F21Y 2105/00* (2013.01); *F21Y 2115/15* (2016.08); *F21Y 2115/30* (2016.08)

(58) Field of Classification Search
CPC .............. H01L 33/508; F21Y 2115/30; F21Y 2115/15; F21Y 2101/00; F21Y 2105/00
USPC ................. 362/97.1, 97.2, 97.3, 84
See application file for complete search history.

(56) References Cited

U.S. PATENT DOCUMENTS

| | | | | |
|---|---|---|---|---|
| 2012/0287605 | A1* | 11/2012 | Chen | H01L 27/322 362/97.1 |
| 2013/0001597 | A1 | 1/2013 | Anc et al. | |
| 2013/0070443 | A1* | 3/2013 | Pan | C09K 9/02 362/84 |
| 2013/0258638 | A1* | 10/2013 | Wang | H01L 33/505 362/84 |
| 2014/0160725 | A1* | 6/2014 | Sutardja | H05B 33/0827 362/84 |
| 2014/0160728 | A1* | 6/2014 | Kim | H01L 25/0753 362/84 |
| 2014/0307442 | A1* | 10/2014 | Ting | F21K 9/56 362/293 |
| 2015/0131280 | A1* | 5/2015 | Harbers | F21K 9/54 362/235 |

FOREIGN PATENT DOCUMENTS

| | | |
|---|---|---|
| WO | WO2011109097 | 9/2011 |
| WO | WO2011147521 | 12/2011 |

OTHER PUBLICATIONS

First Office Action dated Jul. 29, 2016, Chinese Application No. 201380018705X, 7 pages.

Office Action dated Oct. 7, 2016, European Application No. 13722847.4, 8 pages.

* cited by examiner

FULL SPECTRUM LIGHT EMITTING ARRANGEMENT

CROSS-REFERENCE TO PRIOR APPLICATIONS

This application is the U.S. National Phase application under 35 U.S.C. §371 of International Application No. PCT/IB2013/052652, filed on Apr. 3, 2013, which claims the benefit of U.S. Provisional Patent Application No. 61/620,522, filed on Apr. 5, 2012. These applications are hereby incorporated by reference herein.

FIELD OF THE INVENTION

The present invention relates to solid state light emitting arrangements comprising using quantum dots as wavelength conversion materials.

BACKGROUND OF THE INVENTION

In the development of new products within the field of lighting much effort is made to design light sources producing a full spectrum, i.e. a light output including all wavelengths of visible light. There is also a demand for light sources with a continuous spectrum showing black body emission at various correlated color temperatures (CCTs). Such full spectrum lighting is white light having a smooth intensity spectrum without sharp spikes or dips. This demand is based on the insight that while daylight is the best light, a continuous full spectrum artificial light is the second best. There are many claimed benefits of a continuous full spectrum, for examples that full spectrum lighting improves color perception, improves visual clarity, improves mood, improves productivity, improves mental awareness, increases retail sales, improves plant growth, improves results of light therapy in treating seasonal affective disorder (SAD) and sleep disorders, improves scholastic performance of students, improves vitamin D synthesis in the body, and reduces incidence of dental decay.

Various incandescent claimed full-spectrum lamps are commercially available such as a fluorescent T12 lamp. However, the spectra of these incandescent lamps are still showing spikes and/or dips. In addition, incandescent claimed full-spectrum lamps are also relatively energy-consuming.

Figure 13:
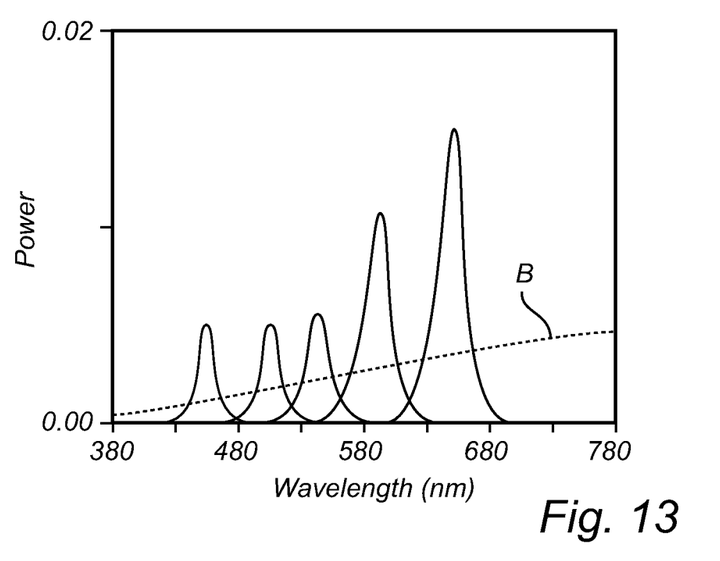
FIG. 13 is a graph showing a typical output spectrum of a conventional light emitting arrangement comprising a plurality of differently colored LEDs.

LEDs emitting different colors (without phosphors) can be used to a obtain desirable CCT and CRI. However, the spectrum obtained with such direct emitters is very peaked with large dips, see FIG. 13. Using direct LEDs no full spectrum lighting can be made. Another drawback of using different direct LEDs is that each LED needs a different driving current. Furthermore, due to different temperature dependencies of different LEDs would require the current for at least some of the LEDs to be adjusted as a function of the temperature).

Figure 12:
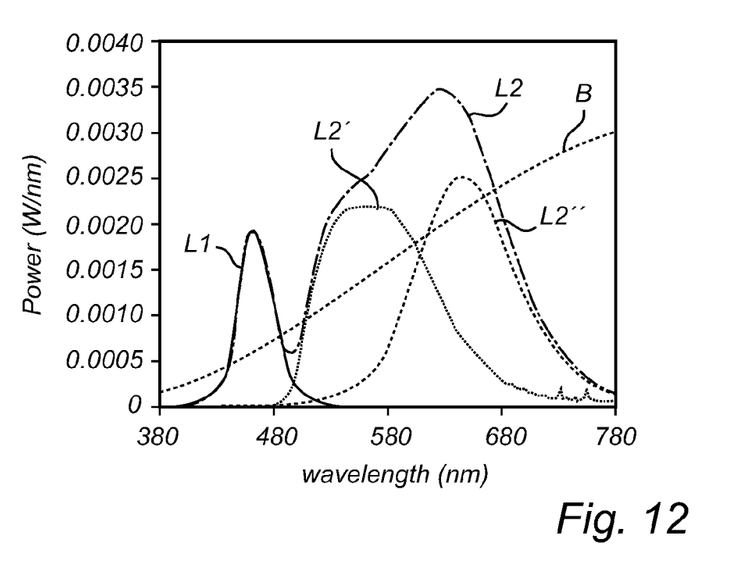
FIG. 12 is a graph showing a typical output spectrum of a conventional phosphor-converted LED.

Using phosphor-converted light emitting diodes (LEDs) it is also difficult to obtain full spectrum lighting without spikes and/or dips in the spectrum. In phosphor-converted LEDs blue light is partially converted to yellow/orange/red light in order to obtain white light. However, the spectrum with such phosphor converted LEDs always show a peaked spectrum with dips. FIG. 12 shows a spectrum of blue LED which is partially converted to yellow and red light by a yellow and red phosphor, respectively, in order to obtain white light having CCT of 300 0K and a color rendering index (CRI) of 90. It is difficult to fill in the gaps of this spectrum using conventional organic and inorganic phosphors, which are broad band emitters, to obtain continuous full back body emission.

US 2005/0135079 suggests an LED device for a flash module which produces white light with a higher CRI than prior flash modules. The device comprises a light source producing primary light and a wavelength converting overlay including a plurality of quantum dots dispersed in a matrix material. The quantum dots may be selected to have different secondary emission wavelengths to produce a broad emission from the light emitting device. In some embodiments, quantum dots are combined with conventional phosphor material. However, a drawback of the device described in this document is that re-absorption of the secondary light may lead to reduced efficiency and it becomes difficult to make a fine tuning of a desired spectrum.

Hence, there remains a need in the art for improved full-spectrum light sources.

SUMMARY OF THE INVENTION

It is an object of the present invention to overcome this problem, and to provide a light emitting arrangement which produces a continuous spectrum light output.

According to a first aspect of the invention, this and other objects are achieved by a light emitting arrangement adapted to provide a total light output spectrum, comprising:
  a solid state light source adapted to emit primary light; and
  a wavelength converting member arranged to receive said primary light and comprising a plurality of wavelength converting domains comprising wavelength converting material for converting primary light into secondary light, each wavelength converting domain thereby providing a sub-range of the total light output spectrum,
wherein at least some of said wavelength converting domains are arranged as an array, typically an array of pixels, and comprise quantum dots, wherein different wavelength converting domains comprise quantum dots having different secondary light emission ranges providing different sub-ranges of the total light output spectrum, and wherein a sub-range provided by each wavelength converting domain overlaps with, or is at least contiguous with, at least one other sub-range provided by another wavelength converting domain.

The light emitting arrangement produces a more continuous spectrum, with smaller of virtually no dips. By arranging materials having different wavelength conversion properties in different domains, preferably in a plane, re-absorption of secondary emission can be avoided.

Typically, the intensity of the total light output spectrum does not deviate at any wavelength by more than 20% from the corresponding black body emission spectrum, said black body emission spectrum corresponding to a black body temperature in the range of from 500 K to 10 000 K. By "corresponding black body emission spectrum" is meant the best fit of a black body spectrum to the light output spectrum of the light emitting arrangement in the range of 450-610 nm. The black body spectrum should correspond to a black body temperature somewhere in the range of from 500 to 10,000 K.

In embodiments of the invention, the wavelength converting domains together provide secondary light including all wavelengths of the range from 400 nm to 800 nm. Such a full spectrum is beneficial for many applications and purposes, as indicated above.

In embodiments of the invention, each wavelength converting domain comprises one type of quantum dots.

Furthermore, in some embodiments, at least one domain comprises a broad band emitting wavelength converting material providing a broad sub-range of the light output spectrum and which is selected from inorganic phosphor materials and organic phosphor materials. The broad band emitting wavelength converting material may be an inorganic phosphor material selected from the group consisting of yttrium aluminum garnet (YAG), lutetium aluminum garnet (LuAG), BSSN and ECAS. Alternatively, the broad band emitting wavelength converting material may be an organic phosphor, such as a perylene derivative. In embodiments of the invention, at least one domain comprising quantum dots provides a sub-range which partially or completely overlaps with a sub-range provided by the a broad band emitting wavelength converting material, and said domain comprising quantum dots provides secondary light of a higher intensity than the broad band emitting wavelength converting material, at least in that region of overlap.

In embodiments of the invention, a domain comprising a broad band emitting wavelength converting material is a phosphor layer, and said array of domains comprising quantum dots are provided as another layer, typically arranged in the path of light from the solid state light source to the phosphor layer.

In embodiments of the invention the wavelength converting member comprises at least 8 different types of quantum dots, providing at least 8 different sub-ranges. Each type of quantum dot is preferably contained in a separate domain.

A quantum dot used in the light emitting arrangement may, according to embodiments of the invention, have an emission spectrum with a full width at half maximum (FWHM) of 50 nm or less, preferably 40 nm or less. Preferably all quantum dots used have such narrow emission spectrum.

In embodiments of the invention the primary light emitted by the light source is completely converted by the wavelength converting member. Thus, no primary light exits the light emitting arrangement. Alternatively, in other embodiments, the primary light emitted by the light source may be only partially converted by the wavelength converting domain and a non-converted portion said primary light provides a sub-range of said light output spectrum, that is, it may exit the light emitting arrangement.

The light emitting arrangement may further comprise a shielding member arranged in the path of light from the solid state light source to the wavelength converting member. The shielding member is capable of preventing light emitted by the light source from reaching at least one wavelength converting domain. Hence, by preventing emission of at least one sub-range, the emission spectrum may be tuned by elimination of certain wavelengths.

Typically, the solid state light source of the light emitting arrangement is a light emitting diode (LED) or laser diode. The primary light may be in the wavelength range of from 200 nm to 460 nm.

In another aspect, the invention relates to a luminaire comprising a light emitting arrangement as described herein. Such a luminaire may be adapted for any desired application, for example general illumination for home or professional indoor environments, decorative illumination, or light therapy applications.

In another aspect, the invention relates to the use of a plurality of quantum dots having different secondary light emission ranges for providing a continuous total light output spectrum.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

FIG. 9b shows the emission spectrum of the device represented in FIG. 9a

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

The present inventors have found that a light emitting arrangement using a solid state light source, e.g. a UV, violet or blue LED, and a plurality of quantum dots, a continuous, full black body emission spectrum can be obtained.

Figure 1A:
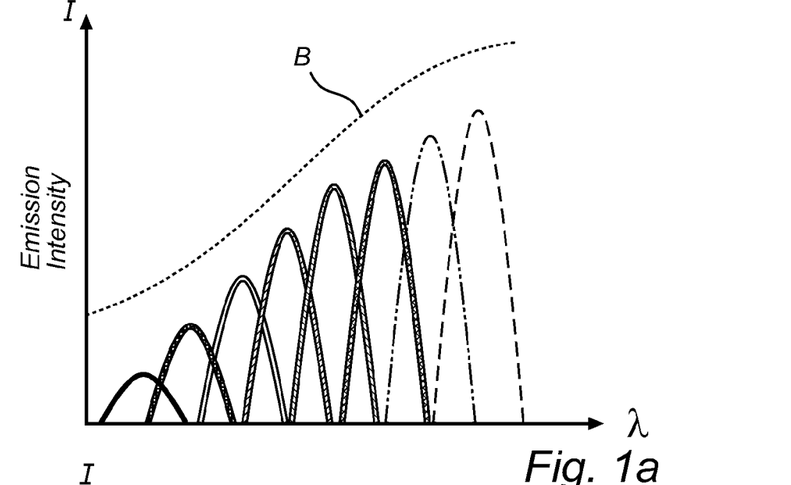
FIG. 1a is a graph illustrating an exemplary emission spectrum of a light emitting arrangement according to embodiments of the invention, and the black body emission spectrum (denoted B).

FIG. 1a schematically illustrates a spectrum that can be obtained by a light emitting arrangement according to embodiments of the invention. The graph shows intensity as a function of wavelength ($\lambda$). The first peak (to the left) represents the shortest visible wavelength, violet light, which may originate from the light source (primary light) or from quantum dots. The further peaks are the result of quantum dot emission (secondary light). The emission band width of each quantum dot is narrow, showing as the distinct peaks in FIG. 1. In order to achieve continuous full black body emission using only quantum dots, multiple types of quantum dots having partly overlapping emission bands are used.

Figure 1B:
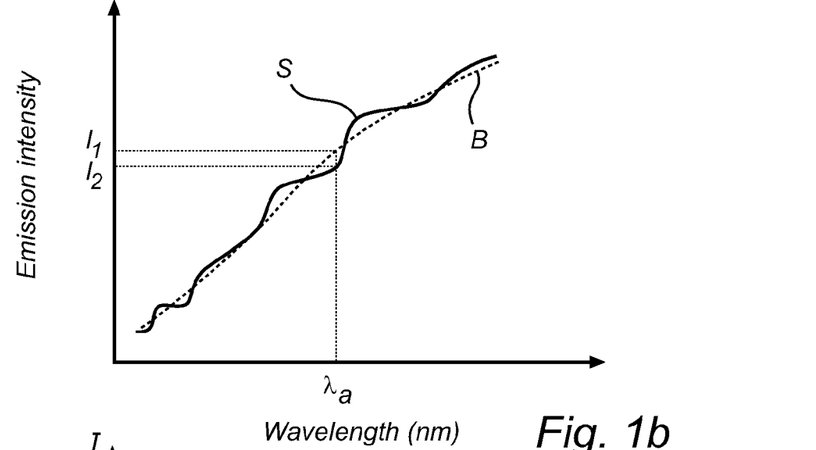
FIG. 1b is a graph illustrating the total output spectrum (S) of a light emitting arrangement according to the invention, and the black body emission spectrum (B).

FIG. 1b illustrates an example of a total light output spectrum S of a light emitting arrangement according to the invention. The spectrum also shows the black body emission spectrum B. As can be seen, the total output spectrum of the light emitting arrangement closely resembles the black body emission over a broad wavelength range, typically from 400 to 800 nm. At a given wavelength $\lambda_a$, the black body emission has intensity $I_1$ and the emission from the light emitting arrangement has intensity $I_2$. Typically, $I_2$ does not deviate (up or down) from $I_1$ by more than 20%, that is $0.8*I_1 \geq I_2 \geq 1.2*I_1$. Hence, large intensity dips in the emission spectrum of the light emitting arrangement are avoided and the emission thus closely resembles full, black body emission.

As used herein, the expressions "continuous spectrum" refers to an emission spectrum which resembles the emission spectrum (intensity as a function of wavelength) of a black body radiator. The black body spectrum for a given black body temperature is a smooth line. "Resembles" here means that for a spectrum superimposed on the black body line the intensity should not deviate at any wavelength by more than 20%, and preferably by not more than 10%. Such a spectrum is thus referred to as a "continuous spectrum", and does not have any strong dips or peaks.

Although FIG. 1 shows only eight emission peaks originating from quantum dots (or seven peaks, if the first peak should originate from the light source), is it envisaged that in embodiments of the invention the light output spectrum may contain a lower or higher number of quantum dot emission peaks. Quantum dots of any specific size typically have a light distribution with a full width at half maximum (FWHM) in the range of 30-60 nm. The position of each emission maximum can be anywhere in the electromagnetic spectrum but preferably somewhere between 400 nm and 800 nm. In order to provide a continuous emission spectrum, typically at least 8 emission peaks are used, but in embodiments of the invention there may be for example 10 emission peaks or more, such as 12 emission peaks or more. A higher number of emission peaks produces a more continuous spectrum, that is a spectrum that is even closer to the black body line.

In embodiments of the invention, fewer than 8 emission peaks may still provide a continuous spectrum, for example where the desired spectrum is not required to cover the whole range from 400 to 800 nm, but should only cover a portion thereof, one example being embodiments in which quantum dots are combined with a broad band emitting phosphor.

"Full width at half maximum" or "FWHM", refers to the width of the wavelength range at the half of the peak intensity of a plot of intensity as a function of wavelength.

As used herein, by "broad band emitting wavelength converting material" or "broad band emitting phosphor material" is meant a wavelength converting material which has an emission spectrum having a FWHM of more than 100 nm.

In contrast, to broad band emitting materials, quantum dots of any specific size typically have a light distribution with a full width at half maximum (FWHM) in the range of 30-60 nm, for example 30-50 nm. As an example a green quantum dot emitter may emit light with a FWHM of $\leq 50$ nm, more preferably $\leq 40$ nm, and most preferably $\leq 30$ nm (FWHM).

In embodiments of the invention however it is possible to use at least some quantum dots which do not have overlapping emission peaks.

Quantum dots and quantum rods are small crystals of semiconducting material generally having a width or diameter of only a few nanometers. When excited by incident light, a quantum dot emits light of a color determined by the size and material of the crystal. Light of a particular color can therefore be produced by adapting the size of the dots. In embodiments of the present invention, the quantum dots may for example have a size in the range of from 1 to 10 nm in at least one direction. As an alternative to quantum dots, quantum rods may be used, which may have a width in the range of from 1 to 10 nm and a length of up to 1 mm or more.

Figure 2:
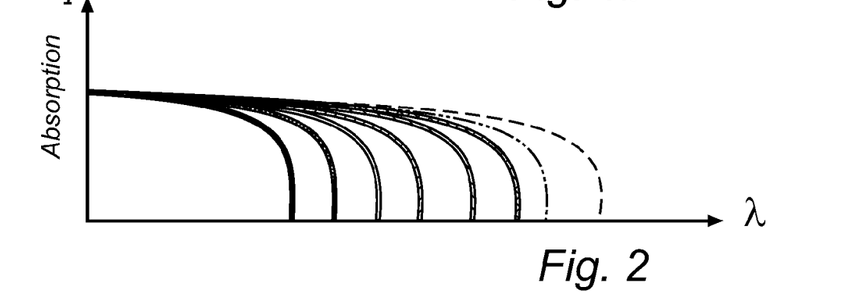
FIG. 2 is a graph showing the absorption spectra of the quantum dots of a light emitting arrangement according to embodiments of the invention.

FIG. 2 is a graph showing the absorption spectra of various quantum dots. As can be seen, the absorption ranges typically overlap. Red-emitting quantum dots usually have the broadest absorption range. Most known quantum dots with emission in the visible range are based on cadmium selenide (CdSe) with shell such as cadmium sulfide (CdS) and zinc sulfide (ZnS). Cadmium free quantum dots such as indium phosphode (InP), and copper indium sulfide (CuInS2) and/or silver indium sulfide (AgInS2) can also be used. Due to the narrow emission bands, quantum dots show show saturated colors. Furthermore the emission color can be tuned by adapting the size of the quantum dots. Any type of quantum dot known in the art may be used in the present invention, provided that it has the appropriate wavelength conversion characteristics. For example, in embodiments of the invention, quantum dots comprising CdSe, InP, $CuInS_2$, or $AgInS_2$ may be used. However, it may be preferred for reasons of environmental safety and concern to use cadmium-free quantum dots or at least quantum dots having a very low cadmium content.

Figure 3:
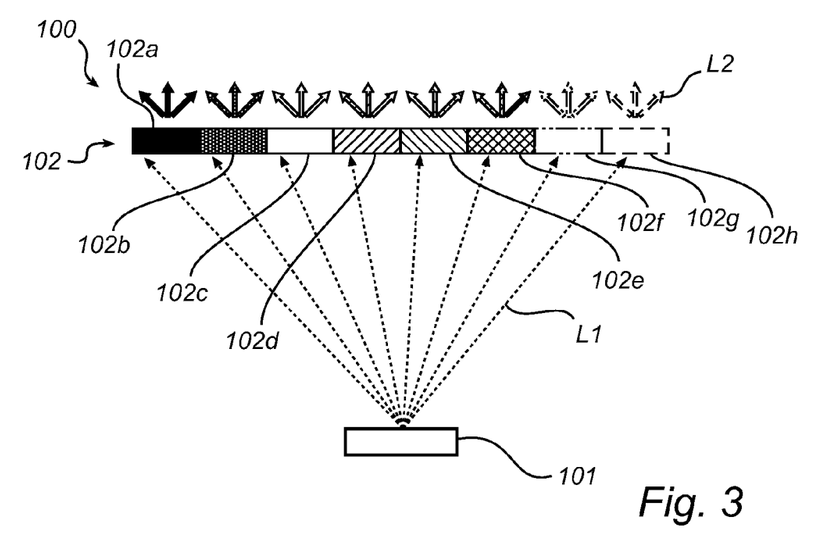
FIG. 3 is a schematic side view of a light emitting arrangement according to embodiments of the invention comprising a pixilated wavelength converting member.

A light emitting arrangement according to the invention is illustrated schematically in FIG. 3. The light emitting arrangement 100 comprises a solid state light source 101 for emitting primary light L1 and a wavelength converting member 102, arranged in the light output direction from the light source so as to receive the primary light L1 and convert at least part of it into secondary light L2. The wavelength converting member 102 comprises a plurality of domains 102a, 102b, 102c etc. At least some of these domains contain quantum dots and form distinct, in-plane regions, arranged in an array. The array may be two-dimensional, forming a matrix. An array arrangement of domains may be referred to as a "pixel arrangement" or pixilated arrangement" within the context of the present invention. Accordingly the individual domains of such an arrangement may be referred to as "quantum dot pixels". Typically, one pixel contains a single type of quantum dot, having a particular secondary emission wavelength. For example, the light source may be an UV LED, and the domain 102a may contain quantum dots converting the primary UV light emitted by the light source into secondary light of 400-440 nm (violet), a domain 102b converting primary light into 440-460 nm (violet blue), a domain 102c converting primary light into 460-480 nm (blue), a domain 102d converting primary light into 490-530 nm (blue green), a domain 102e converting primary light into 530-560 nm (yellow green), a domain 102f converting primary light into 570-620 nm (yellow/orange), domain 102g converting primary light into 620-700 nm (orange) and a domain 102h converting primary light into 700-750 nm (red). The domains 102a-h may be arranged in any order or pattern.

Each sub-range (provided by a wavelength converting domain) is at least contiguous, if not overlapping, with at least one other sub-range provided by another wavelength converting domain. In an exemplary embodiment, using up to 16 wavelength converting domains comprising quantum dots having different emission properties, the different domains may emit light of different sub-ranges as indicated in Table 1.

TABLE 1

Example embodiment sub-ranges

| Domain | Emission wavelengths (converted) |
| --- | --- |
| domain 1 | 400-440 nm - blue violet (BV) light |
| domain 2 | 440-460 nm - violet blue (VB) light |
| domain 3 | 460-480 nm - blue (B) light |
| domain 4 | 480-490 nm - green blue (GB) light |
| domain 5 | 490-500 nm - blue green (BG) light |
| domain 6 | 500-530 nm - green (G) light |
| domain 7 | 530-560 nm - yellow green (YG) light |
| domain 8 | 560-570 nm - green yellow (GY) light |
| domain 9 | 570-580 nm - yellow light |
| domain 10 | 580-590 nm - orange yellow (OY) light |
| domain 11 | 590-600 nm - yellow orange (YO) light |
| domain 12 | 600-620 nm - orange (O) light |
| domain 13 | 620-640 nm - red orange (RO) light |
| domain 14 | 640-700 nm - orange red (OR) light |
| domain 15 | 700-750 nm - red (R) light |
| domain 16 | 750-800 nm - near infrared (NIR) light |

Since quantum dots usually have an absorption peak relatively close to the emission peak, the use of multiple quantum dots representing a continuous range of emission wavelengths might lead to re-absorption of secondary emission, resulting in dips in the total emission spectrum. The present invention avoids such re-absorption by arranging different types of quantum dots having overlapping emission and absorption wavelengths in different pixels. Hence, a continuous spectrum may be achieved, and efficiency is improved.

The amount of wavelength converting material may be adapted to produce a light intensity such that sum of the emission peaks mimics the black body radiation of a desired black body temperature.

Figure 4:
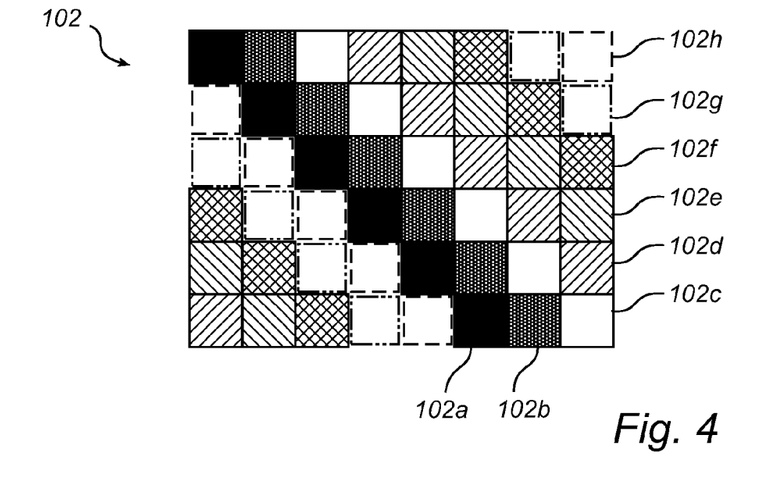
FIG. 4 is a top view of a pixilated wavelength converting member.

The quantum dot pixels described above may be arranged in any suitable pattern, for example a triangular, hexagonal or checkerboard pattern. The pattern may be repetitive or periodic. FIG. 4, representing a top view of a wavelength converting member, shows an exemplary arrangement of quantum dot pixels 102a, 102b, 102c etc. A majority of the wavelength converting pixels are surrounded on all sides (in one plane) by other pixels. One or more of the adjacent surrounding pixels may contain a different type of quantum dot, providing a different secondary light emission range.

Figure 5:
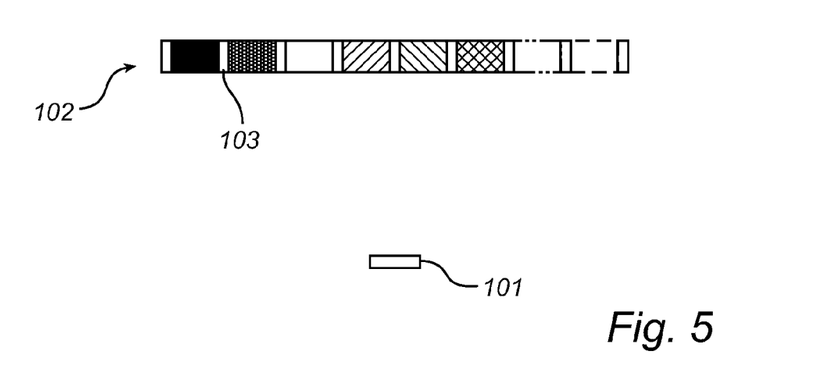
FIG. 5 is a schematic side view of a light emitting arrangement according to embodiments of the invention comprising a pixilated wavelength converting member and separation means.

In embodiments of the invention adjacent wavelength converting domains, in particular adjacent domains of a pixilated arrangement, may be separated by a separating member 103, as shown in FIG. 5. The separating member serves to physically separate the individual pixels, to further reduce the risk of leakage and re-absorption of secondary light by surrounding quantum dot pixels. The separation members 103 may protrude from the surface of the wavelength converting member. The separation members may be opaque or reflective. For example, the barriers may be made of a reflective material such as aluminium, or may be made of a non-reflective material coated with a reflective material such as $Al_2O_3$ or $TiO_2$. In some embodiments, the separating members may be at least partly transmissive to primary light emitted by the light source.

In embodiments of the invention, all light emitted by the solid state light source 101 may be converted by the wavelength converting member 102. In alternative embodiment, only part of the primary light emitted by the light source is converted. For example, in some embodiments only part of the primary light received by a particular wavelength converting domain 102a, 102b etc is converted. In yet other embodiments, some wavelength converting domains achieve full conversion of the received light, whereas other wavelength converting domains achieve conversion of only a part of the received light. In yet other embodiments, to be described in further detail below with reference to FIGS. 9a-b and 10a-b, a shielding member may be provided which blocks light emitted by the light source from being received by a particular wavelength converting domain.

In embodiments of the invention at least one wavelength converting domain may comprise at least one conventional phosphor material, providing secondary emission of a broad wavelength range. Such as phosphor material may be referred to a broad band emitting phosphor within the context of the present invention. Wavelength converting domains comprising a conventional phosphor typically do not form part of a pixilated arrangement, but may be provided as a separate layer or even a separate body, optionally forming a separate, second wavelength converting member.

Figure 7:
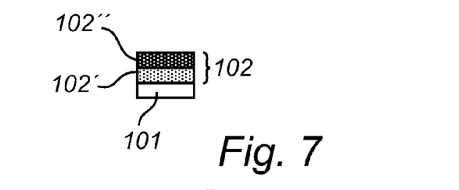
FIG. 7 is a schematic side view of a light emitting arrangement according to embodiments of the invention.

An example of a light emitting arrangement having a wavelength converting member comprising quantum dots as well as a conventional phosphor material is schematically illustrated in FIG. 7. The wavelength converting member 102 comprises a layer 102' comprising quantum dot pixels as described above, and a layer 102" comprising a conventional organic or inorganic phosphor material. Preferably the layer comprising quantum dots is arranged in the path of light between the solid state light source 101 and the phosphor layer 102" in order to avoid re-absorption of quantum dot emission by the phosphor material.

Figure 6A:
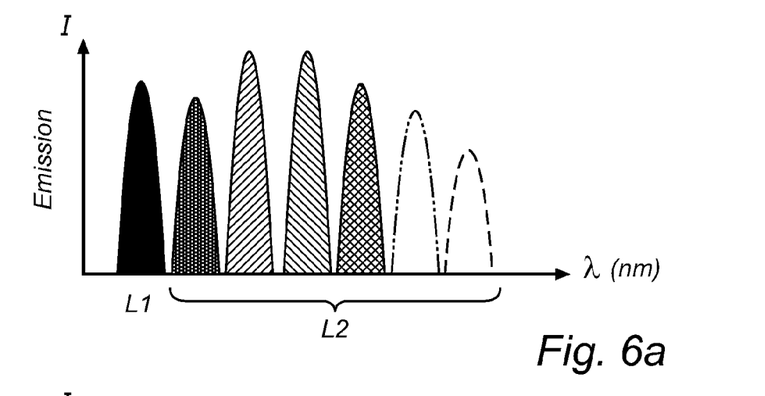
FIG. 6a-b are graphs showing the total emission spectra of quantum dots alone (FIG. 6a) or in combination (FIG. 6b) with a conventional broad band emitting phosphor, according to embodiments of the light emitting arrangement.
Figure 6B:
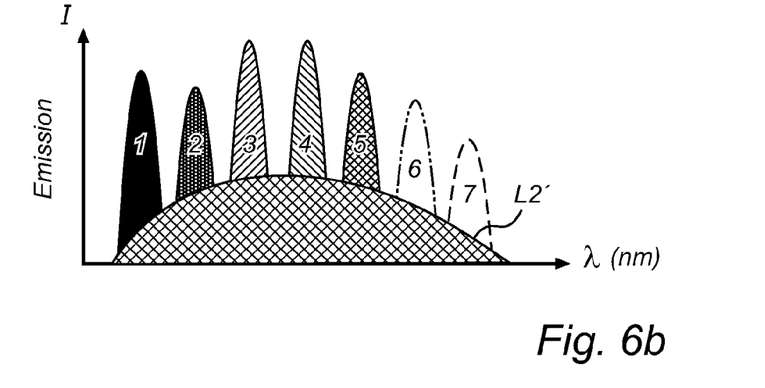

In some embodiments of the present invention it is not necessary that the different emission peaks of the quantum dots overlap as illustrated in FIG. 1 above. For example, in embodiments comprising also at least one broad band emitting phosphor, it may be sufficient that the relatively narrow emission ranges of the quantum dots overlap at least part of the emission range of the broad band emitting phosphor, as illustrated in FIG. 6a-b. FIG. 6a shows the emission peaks of the quantum dots used, and FIG. 6b shows the total output spectrum combining the primary light from the light source (peak 1 in FIG. 6b) and secondary light provided by the broad band emitting phosphor (denoted L2') and by the quantum dots (peaks 2-7), respectively. As can be seen, the quantum dot emission peaks do not overlap each other, but overlaps the emission range of the broad band emitting phosphor. The emission intensity of the broad band emitting phosphor is typically lower than the emission intensity of the quantum dots. It may be noted that the emission spectrum of the broad band emitting phosphor may have other shapes than that shown in FIG. 6b; for example several broad band emitting phosphors may together provide an emission spectrum having several peaks, see FIG. 8 and also FIG. 12.

Figure 8:
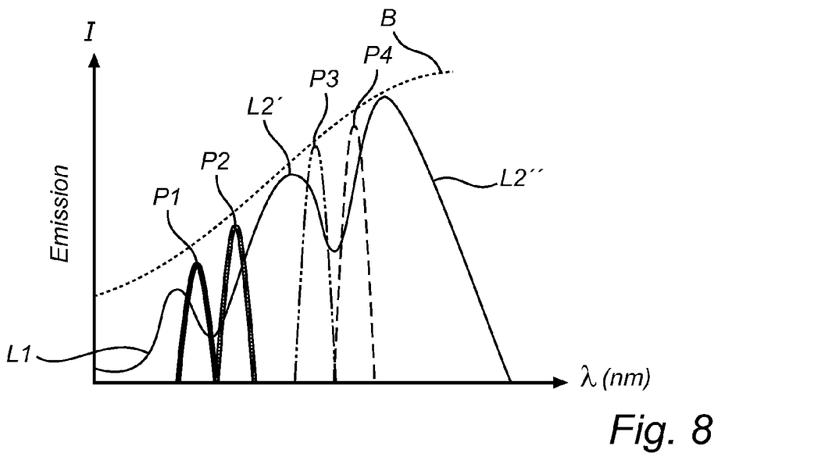
FIG. 8 is a graph showing the emission spectrum of a light emitting arrangement according to embodiments of the invention.

In another embodiment, the output spectrum of which is illustrated in FIG. 8, the wavelength converting member 102 comprises a first broad band emitting phosphor providing secondary emission L2' having typically an FWHM of 150 nm. e.g. 510-660 nm, and a second broad band emitting phosphor L2" providing secondary emission typically having an FWHM of 120 nm, e.g. 590-710 nm. The emission peak originating from the light source primary light is denoted L1 (typically having FWHM of 50 nm, e.g. 380-430 nm). In order to fill in the gaps of the combined output spectrum of the first and the second phosphors and the light source, the wavelength converting member further comprises quantum dots, arranged in different pixels, providing emission peaks P1, P2, P3 and P4 at for example at 430-470 nm, 470-510 nm, 590-630 nm and 630-660 nm, respectively.

The wavelength converting member may be arranged at a remote position with respect to the light source, i.e., the wavelength converting member and the light source may be mutually spaced apart, as schematically shown in e.g. FIG. 3. Alternatively, the wavelength converting member may be arranged in the vicinity of the light source, at a small distance therefrom. In other embodiments, the wavelength converting member may be arranged directly on the light source (see FIG. 7).

Figure 11:
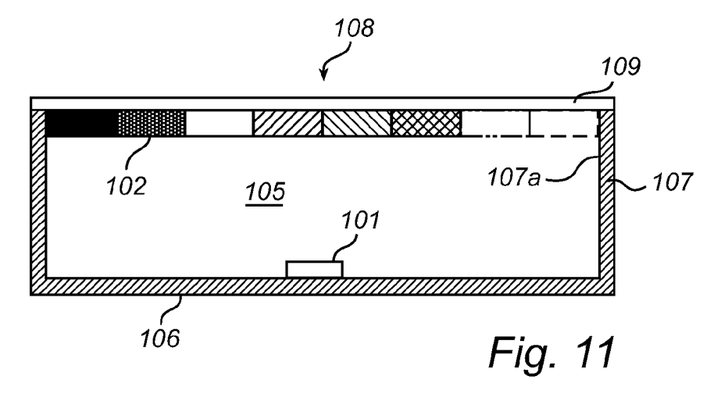
FIG. 11 is a cross-sectional side view of a light emitting arrangement comprising a light mixing chamber.

In embodiments of the invention the light emitting arrangement comprises a light mixing chamber, in which the light source is arranged. Typically the light mixing chamber is defined by at least one side wall which may be reflective, and a light exit window. In some embodiments, wavelength converting member may be arranged in the light exit window. FIG. 11 illustrates a light emitting arrangement 100 comprising a light mixing chamber 105 defined by a base portion 106 and at least one side wall 107. The solid state light source 101 may be provided on the base portion. In the case of a single light source, the light source is typically positioned centrally on the base portion, In the case of two or more light sources, the light sources may be arranged symmetrically around a center of the base portion. It is however contemplated the light sources may be provided on a side wall or at any other suitable location in the light mixing chamber. The at least one side wall 107 defines a light exit window 108 in which the wavelength converting member 102 is positioned, at a location remote from the light source. In other embodiments, the wavelength converting member may instead be provided within the light mixing chamber 105.

A surface 107a of the at least one side wall 107 facing the interior of the chamber may be reflective, e.g. provided with a layer of reflective material, in order to provide homogeneous distribution of the light to be received by the wavelength converting member, and/or to provide a more homogeneous distribution on secondary light from the wavelength converting member and good mixing with primary light. The reflectivity of the reflective side wall is preferably at least 80%, more preferably at least 90%, and even more preferably at least 95%. Typically the reflective layer may be diffuse reflective.

Optionally, the light emitting arrangement may further comprise a diffuser 109 arranged on a side of the wavelength converting member facing towards the light output direction (i.e., not facing towards the light source). Such a diffuser may be provided in the light exit window 108 or outside of the light mixing chamber 105.

In embodiments of the invention, the solid state light source emits primary light of from 200 to 460 nm, corresponding to UV, violet light and blue light. Typically the primary light may be in the range of 440 to 460 nm. Thus, in embodiments where the solid-state light source is an LED, it may be a UV, violet and blue emitting LED such as GaN or InGaN based LED. Organic light emitting diodes (OLEDs) or laser diodes emitting primary light of suitable wavelength range may also be used.

The broad band emitting phosphor material may be an inorganic material or an organic material. Examples of inorganic wavelength converting materials may include, but are not limited to, cerium (Ce) doped YAG ($Y_3Al_5O_{12}$) or LuAG ($Lu_3Al_5O_{12}$). Ce doped YAG emits yellowish light, whereas Ce doped LuAG emits yellow-greenish light. Examples of other inorganic phosphors materials which emit red light may include, but are not limited to ECAS (ECAS, which is $Ca_{1-x}AlSiN_3:Eu_x$ wherein $0<x\leq 1$; preferably $0<x\leq 0.2$) and BSSN (BSSNE, which is $Ba_{2-x-z}M_xSi_{5-y}A-l_yN_{8-y}O_y:Eu_z$ wherein M represents Sr or Ca, $0\leq x\leq 1$ and preferably $0\leq x\leq 0.2$, $0\leq y\leq 4$, and $0.0005\leq z\leq 0.05$).

Examples of suitable organic phosphor materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen®F170. Advantageously, a layer comprising organic luminescent material may be transparent and non-scattering.

Optionally the wavelength converting member, for example a domain or layer comprising a broad band emitting phosphor material, may comprise scattering elements. Examples of scattering elements include pores and scattering particles, such as particles of $TiO_2$ or $Al_2O_3$.

For some applications it may be desirable to enhance one or more particular colors of an illuminated object. This may be achieved by illumination with a light emitting arrangement producing a non-continuous emission spectrum lacking certain wavelengths. The present invention offers a solution also to this problem, by using a wavelength converting member comprising a pixilated arrangement of quantum dots having different, optionally overlapping, emission wavelengths, and a shielding member arranged in the path of light between the solid state light source and at least one pixel of the wavelength converting member. The emission ranges of the quantum dots of different pixels may overlap, such that except for the wavelengths not emitted due to shielding by the shielding member, the spectrum would be continuous.

The use of a shielding member may however also be very useful in combination with a pixilated arrangement of quantum dots where the emission ranges of the different quantum dots do not overlap, such that the wavelength converting member produces a discontinuous spectrum also in the absence of a shielding member.

Figure 9A:
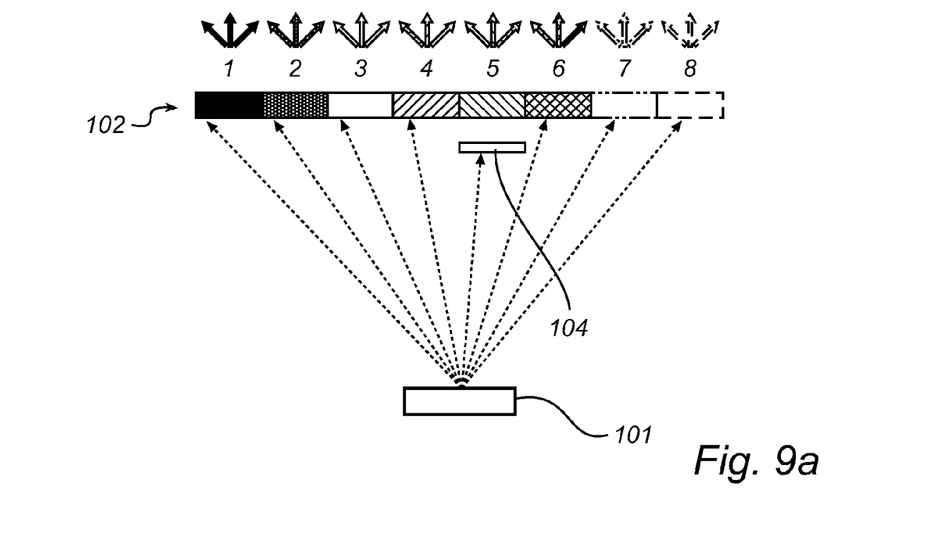
FIG. 9a is a schematic side view of a light emitting arrangement according to embodiments of the invention comprising a pixilated wavelength converting member and a shielding member.
Figure 9B:
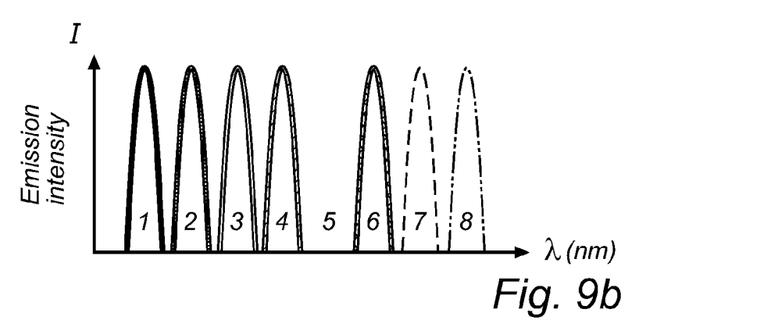

The general structural of an example embodiment of such a light emitting arrangement is illustrated in FIG. 9a. As shown in FIG. 9a, a shielding member 104 may have dimensions roughly corresponding to a single wavelength converting domain (pixel), or slightly smaller. Thus, when arranged in the path of light from the light source 101 to the wavelength converting member 102, the shielding member blocks light from being received by a particular pixel (here pixel 5), resulting in a spectrum as shown for example in FIG. 9b, lacking a particular wavelength range corresponding to the emission of the shielded wavelength converting pixel.

The shielding member 104 may block an entire wavelength converting pixel or a part thereof. It is also possible that the shielding member at least partially blocks two or more pixels simultaneously. The dimensions (in particular the width) of the shielding member may thus be chosen to cover more than one pixel.

In some embodiments, the light emitting arrangement comprises a plurality of shielding members. For example, two or more shielding members may be arranged in one plane. In other embodiments, each shielding member may be arranged in a separate plane, e.g. in separate layers.

The shielding member may be completely opaque, thus blocking all incident light. However, in some embodiments it may also be partly transmissive. Alternatively, the shielding member may be patterned.

In some embodiments, the shielding member may be controllable by a user of the light emitting arrangement. For example, the position of the shielding member may be reversibly adjustable. In one embodiment, a shielding member is mechanically movable between different positions, corresponding to shielding of different pixels.

Figure 10A:
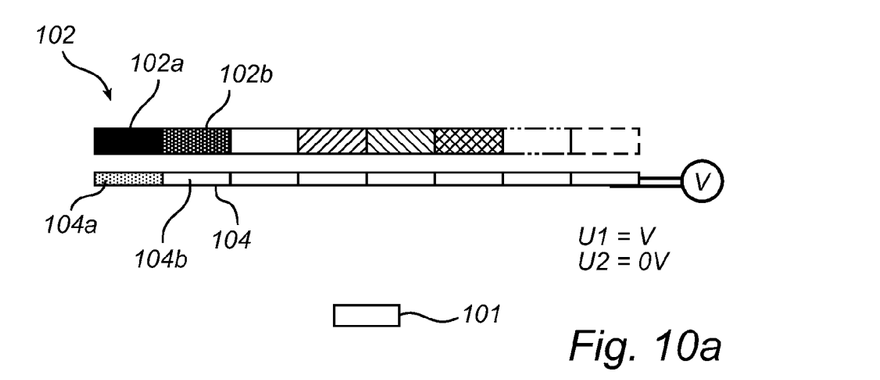
FIG. 10a-b are schematic side views of a light emitting arrangement according to embodiments of the invention comprising a pixilated wavelength converting member and an electrically controllable shielding member.
Figure 10B:
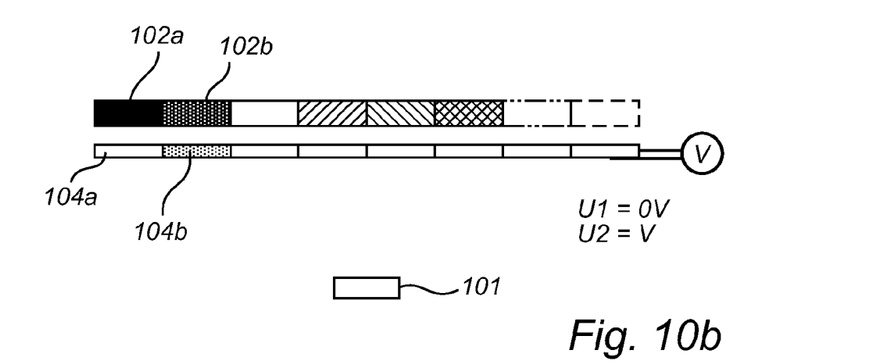

In other embodiments, control of shielding effect may be achieved by electrical means. For example, the shielding member may comprise an electrically controllable layer comprising a plurality of independently controllable shielding domains, each domain being arranged to potentially shield a wavelength converting pixel. The electrically controllable layer may for example comprise an electro-optical device whose optical properties (in particular light transmission) may be controlled by the application of an electric potential. FIGS. 10a-b illustrate an example of such a light emitting arrangement. Each shielding domain 104a, 104b may be reversibly switchable between a transmissive state (e.g. domain 104b of FIG. 10a, and domain 104a of FIG. 10b) where light can be received by a corresponding wavelength converting pixel located behind said shielding domain as seen from the light source, and a light blocking or shielding state (domain 104a of FIG. 10a, and domain 104b of FIG. 10b), in which the shielding domain is non-transmissive and thus blocks light from reaching the corresponding wavelength converting pixel. Examples of suitable electrically controllable devices include liquid crystal devices, such as polymer dispersed liquid crystal (PDLC) devices or liquid crystal gel devices, in-plane switching electrophoretic devices, electrochromic devices and electrowetting devices.

The person skilled in the art realizes that the present invention by no means is limited to the preferred embodiments described above. On the contrary, many modifications and variations are possible within the scope of the appended claims.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A light emitting arrangement (100) adapted to provide a total light output spectrum, comprising:
   a solid state light source (101) adapted to emit primary light (L1); and
   a wavelength converting member (102) arranged to receive said primary light and comprising a plurality of wavelength converting domains (102a, 102b, 102c, 102d, 102 e, 102f, 102g, 102h) comprising wavelength converting material for converting primary light into secondary light (L2), each wavelength converting domain thereby providing a sub-range of the total light output spectrum,
   wherein at least some of said wavelength converting domains are arranged as an array and comprise quantum dots, wherein different wavelength converting domains comprise quantum dots having different secondary light emission ranges providing different sub-ranges of the total light output spectrum, wherein a sub-range provided by each wavelength converting domain overlaps or is contiguous with at least one other sub-range provided by another wavelength converting domain, and wherein said wavelength converting domains together provide secondary light including all wavelengths of the range from 400 nm to 800 nm.

2. A light-emitting arrangement according to claim 1, wherein the intensity of the total light output spectrum does not deviate at any wavelength by more than 20% from the corresponding black body emission spectrum, said black body emission spectrum corresponding to a black body temperature in the range of from 500 K to 10 000 K.

3. A light emitting arrangement according to claim 1, wherein each wavelength converting domain comprises one type of quantum dots.

4. A light emitting arrangement according to claim 1, wherein at least one domain comprises a broad band emitting wavelength converting material providing a broad sub-range of the light output spectrum and which is selected from inorganic phosphor materials and organic phosphor materials.

5. A light emitting arrangement according to claim 4, wherein at least one domain comprising quantum dots provides a sub-range which partially or completely overlaps with a sub-range provided by the a broad band emitting wavelength converting material, and said domain comprising quantum dots provides secondary light of a higher intensity than the broad band emitting wavelength converting material.

6. A light emitting arrangement according to claim 5, comprising at least 8 different types of quantum dots.

7. A light emitting arrangement according to claim 1, wherein the wavelength converting material comprises quantum dots having an emission with a full width at half maximum (FWHM) of 50 nm or less.

8. A light emitting arrangement according to claim 4, wherein a domain comprising a broad band emitting wavelength converting material is a phosphor layer, and said array of domains comprising quantum dots are provided as another layer.

9. A light emitting arrangement according to claim 1, wherein the primary light emitted by the light source is completely converted by the wavelength converting domain.

10. A light emitting arrangement according to claim 1, wherein the primary light emitted by the light source is only partially converted by the wavelength converting domain and a non-converted portion said primary light provides a sub-range of said light output spectrum.

11. A light emitting arrangement according to claim 1, further comprising a shielding member (104) arranged in the path of light from the solid state light source to the wavelength converting member and capable of preventing light emitted by the light source from reaching at least one wavelength converting domain.

12. A light emitting arrangement according to claim 1, wherein the solid state light source is a light emitting diode (LED) or laser diode and said primary light is in the wavelength range of from 200 nm to 460 nm.

13. A luminaire comprising a light emitting arrangement according to claim 1.

* * * * *